United States Patent
Kim et al.

(10) Patent No.: US 9,251,910 B2
(45) Date of Patent: Feb. 2, 2016

(54) SEMICONDUCTOR MEMORY DEVICE AND OPERATING METHOD THEREOF

(71) Applicant: SK hynix Inc., Icheon-si Gyeonggi-do (KR)

(72) Inventors: Tae Gyun Kim, Icheon-si Gyeonggi-do (KR); Hee Youl Lee, Icheon-si Gyeonggi-do (KR); Se Hoon Kim, Gunpo-si Gyeonggi-do (KR); Ji Hyun Seo, Seoul (KR); Dong Hun Lee, Suwon-si Gyeonggi-do (KR); Jung Shik Jang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/331,364

(22) Filed: Jul. 15, 2014

(65) Prior Publication Data
US 2015/0221389 A1    Aug. 6, 2015

(30) Foreign Application Priority Data
Feb. 6, 2014    (KR) ........................ 10-2014-0013761

(51) Int. Cl.
| | |
|---|---|
| *G11C 16/04* | (2006.01) |
| *G11C 16/34* | (2006.01) |
| *H01L 27/115* | (2006.01) |
| *G11C 16/26* | (2006.01) |

(52) U.S. Cl.
CPC ........ *G11C 16/3445* (2013.01); *G11C 16/0466* (2013.01); *G11C 16/26* (2013.01); *H01L 27/11582* (2013.01)

(58) Field of Classification Search
CPC ............... G11C 16/0483; G11C 16/26; G11C 16/0441; G11C 16/0466; G11C 16/3418; G11C 16/3427; G11C 16/3436; G11C 16/3445; H01L 27/11582; H01L 29/7926; G06F 11/1068
USPC ............. 365/185.02, 185.11, 185.17, 198.02, 365/185.05
See application file for complete search history.

(56) References Cited

U.S. PATENT DOCUMENTS

2014/0244909 A1 *    8/2014    Shirakawa et al. ........... 711/103

FOREIGN PATENT DOCUMENTS

| | | |
|---|---|---|
| KR | 1020080111580 A | 12/2008 |
| KR | 1020120005831 A | 1/2012 |
| KR | 1020120094710 A | 8/2012 |

* cited by examiner

*Primary Examiner* — Thong Q Le
(74) *Attorney, Agent, or Firm* — William Park & Associates Ltd.

(57) ABSTRACT

Provided are a semiconductor memory device and an operating method thereof. The semiconductor memory device may include a memory cell array having a plurality of strings each including a drain select transistor, a plurality of drain side memory cells, a pipe transistor, a plurality of source side memory cells, and a source select transistor. The semiconductor memory device may also include a peripheral circuit suitable for providing a plurality of operation voltages including an erase verify voltage to the plurality of strings, and a control logic suitable for controlling the peripheral circuit to adjust a voltage level of the erase verify voltage applied to a selected memory cell, from among the plurality of drain side memory cells and the plurality of source side memory cells, according to a distance between the selected memory cell and the pipe transistor when an erase verify operation is performed.

25 Claims, 7 Drawing Sheets

US 9,251,910 B2

SEMICONDUCTOR MEMORY DEVICE AND OPERATING METHOD THEREOF

CROSS-REFERENCE TO RELATED APPLICATION

The present application claims priority to Korean patent application number 10-2014-0013761 filed on Feb. 6, 2014, in the Korean Intellectual Property Office, the entire disclosure of which is incorporated by reference herein.

BACKGROUND

1. Technical Field

Various embodiments relate generally to an electronic device, and more particularly, to a semiconductor memory device and an operating method thereof.

2. Related Art

Semiconductor memory devices are memory devices implemented by using semiconductor materials such as silicon (Si), germanium (Ge), gallium arsenide (GaAs), indium phosphide (InP), and the like. The semiconductor memory devices are classified into volatile memory devices and nonvolatile memory devices.

The volatile memory devices are memory devices in which stored data is lost when their power supply is interrupted. The volatile memory devices include a static random access memory (SRAM), a dynamic RAM (DRAM), a synchronous DRAM (SDRAM), etc. The nonvolatile memory devices are memory devices that retain stored data even when their power supply is interrupted. The nonvolatile memory devices include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc. The flash memories are classified into a NOR type and a NAND type.

The flash memory devices can be classified into 2-dimensional semiconductor devices in which strings are horizontally formed on a semiconductor substrate. The flash memory devices can also be classified into 3-dimensional semiconductor devices in which strings are vertically formed on a semiconductor substrate.

3-dimensional semiconductor devices may be designed to solve the limitations of 2-dimensional semiconductor devices. These limitations may relate to the degrees of integration that can be provided by 2-dimensional semiconductor devices. As such, 3-dimensional semiconductor devices may be designed to have a plurality of strings vertically formed on a semiconductor substrate are included. The strings include a drain select transistor, memory cells, and a source select transistor, which are coupled in series between a bit line and a source line.

BRIEF SUMMARY

In an embodiment a semiconductor memory device may include a memory cell array having a plurality of strings each including a drain select transistor, a plurality of drain side memory cells, a pipe transistor, a plurality of source side memory cells, and a source select transistor. The semiconductor memory device may also include a peripheral circuit suitable for providing a plurality of operation voltages including an erase verify voltage to the plurality of strings and a control logic suitable for controlling the peripheral circuit to adjust a voltage level of the erase verify voltage applied to a selected memory cell, from among the plurality of drain side memory cells and the plurality of source side memory cells, according to a distance between the selected memory cell and the pipe transistor when an erase verify operation is performed.

In an embodiment a semiconductor memory device may include a memory cell array having a plurality of strings each including a drain select transistor, a plurality of drain side memory cells, a pipe transistor, a plurality of source side memory cells, and a source select transistor. The semiconductor memory device may also include a peripheral circuit suitable for providing a plurality of operation voltages including an erase verify voltage to the string, and a control logic suitable for controlling the peripheral circuit to adjust a voltage level of a pipe transistor operation voltage applied to the pipe transistor according to a distance between the pipe transistor and a selected memory cell, from among the plurality of drain side memory cells and the plurality of source side memory cells, when a read operation is performed.

In an embodiment an operating method of a semiconductor memory device may include applying a read voltage to a selected memory cell, from among a plurality of memory cells of a memory cell string and a pass voltage to non-selected memory cells when a read operation is performed. The operating method may also include applying a first voltage to a pipe transistor of the memory cell string when the selected memory cell is adjacent to a source select transistor or a drain select transistor and applying a second voltage to the pipe transistor when the selected memory cell is adjacent to the pipe transistor.

DETAILED DESCRIPTION

Hereinafter, various embodiments will be described in detail with reference to the accompanying drawings. The figures are provided to allow those having ordinary skill in the art to understand the scope of the embodiments of the disclosure. The embodiments may, however, be embodied in different forms and should not be construed as limited to the embodiments set forth herein. Rather, these embodiments are provided so that this disclosure will be thorough and complete, and will fully convey the scope of the present invention to those skilled in the art.

Throughout this specification, when an element is referred to as being "coupled" to another element, it includes that the element can be "directly coupled" to the other element or "indirectly coupled" to the other element with other intervening element(s). Throughout this specification, when a certain part "includes" a certain component, it means that another component may be further included not excluding other components unless otherwise defined.

Various embodiments may relate, for example but not limited to, a 3-dimensional semiconductor memory device and an operating method thereof in which degradation of threshold voltage characteristics of memory cells may be improved when an erase verify operation and a read operation are performed.

Figure 1:
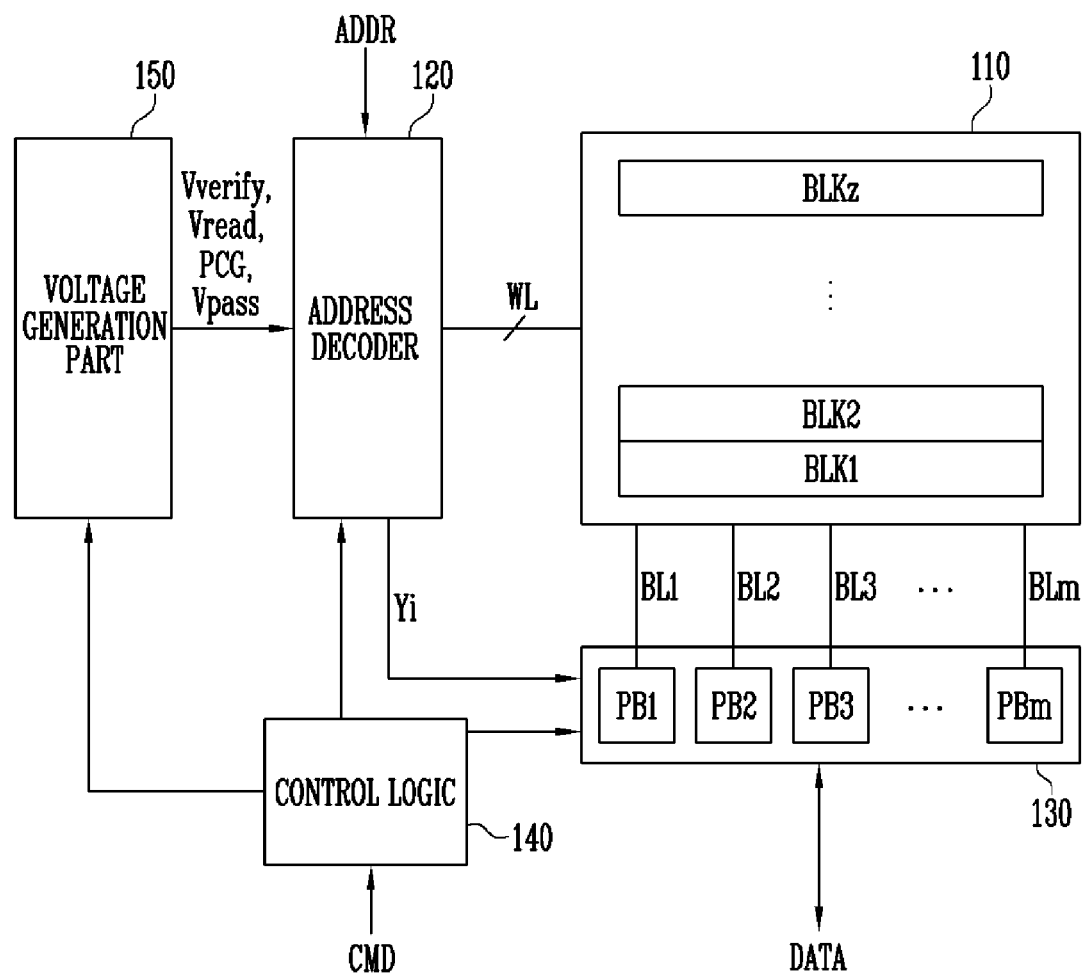
FIG. 1 is a block diagram illustrating a representation of a semiconductor memory device according to an embodiment.

FIG. 1 is a block diagram illustrating a representation of a semiconductor memory device according to an embodiment.

Referring to FIG. 1, a semiconductor memory device 100 may include a memory cell array 110, an address decoder 120, and a read/write circuit 130. The semiconductor memory device 100 may also include a control logic 140 and a voltage generation part 150.

The memory cell array 110 may include a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz may include a plurality of memory cells. According to an embodiment, the plurality of memory cells may be non-volatile memory cells. Memory cells coupled to the same word line, among the plurality of memory cells, are defined as one page. In other words, the memory cell array 110 includes a plurality of pages.

Further, each of the plurality of memory blocks BLK1 to BLKz in the memory cell array 110 may include a plurality of strings. Each of the plurality of strings may include a drain select transistor, a plurality of drain side memory cells, and a pipe transistor. Each of the plurality of strings may also include a plurality of source side memory cells, and a source select transistor, which are coupled in series between the bit line and a source line.

The address decoder 120, the read/write circuit 130, and the voltage generation part 150 may operate as peripheral circuits for driving the memory cell array 110.

The address decoder 120 is coupled to the memory cell array 110 through the word lines WL. The address decoder 120 operates in response to control of the control logic 140. The address decoder 120 receives an address ADDR through an input/output buffer (not shown) in the semiconductor memory device 100.

The address decoder 120 decodes a row address among the received addresses ADDR, and applies a verify voltage Vverify, a pass voltage Vpass, a pipe transistor operation voltage PCG, and a plurality of operation voltages, which are generated from the voltage generation part 150, to the plurality of drain side memory cells, the source side memory cells, the drain and source select transistors, and the pipe transistor in the memory cell array 110 according to the decoded row address when an erase verify operation is performed. Further, the address decoder 120 decodes a row address among the received addresses ADDR, and applies a read voltage Vread, the pass voltage Vpass, the pipe transistor operation voltage PCG, and a plurality of operation voltages, which are generated from the voltage generation part 150, to the plurality of drain side memory cells, the source side memory cells, the drain and source select transistors, and the pipe transistor in the memory cell array 110 according to the decoded row address when a read operation is performed.

When a read operation is performed, the address decoder 120 decodes a column address among the received address ADDR. The address decoder 120 transmits a decoded column address Yi to the read/write circuit 130.

A read operation of the semiconductor memory device 100 is performed in units of pages. The address ADDR received when a read operation is requested includes a block address, a row address, and a column address. The address decoder 120 selects one memory block and one word line according to the block address and the row address. The column address is decoded by the address decoder 120, and provided to the read/write circuit 130.

The address decoder 120 may include a block decoder, a row decoder, a column decode, and an address buffer, etc.

The read/write circuit 130 includes a plurality of page buffers PB1 to PBm. The plurality of page buffers PB1 to PBm are coupled to the memory cell array 110 through the bit lines BL1 to BLm. Each of the plurality of page buffers PB1 to PBm senses voltage levels of the bit lines BL1 to BLm in the memory cell array 110, and verifies whether the memory cells are erased when an erase verify operation is performed. Each of the plurality of page buffers PB1 to PBm senses and stores data stored in the memory cells by sensing the voltage levels of the bit lines BL1 to BLm in the memory cell array 110 when a read operation is performed. Further, each of the plurality of page buffers PB1 to PBm precharges the voltage levels of the bit lines BL1 to BLm before sensing the voltage levels of the bit lines BL1 to BLm when an erase verify operation and a read operation are performed.

The read/write circuit 130 operates in response to control of the control logic 140.

According to an embodiment, the read/write circuit 130 may include page buffers (or page registers) and a column select circuit, etc.

The control logic 140 is coupled to the address decoder 120, the read/write circuit 130, and the voltage generation part 150. The control logic 140 receives a command CMD through the input/output buffer (not shown) in the semiconductor memory device 100. The control logic 140 controls overall operations of the semiconductor memory device 100 in response to the command CMD. The control logic 140 controls the voltage generation part 150 to adjust a voltage level of the verify voltage Vverify, which is applied to a selected memory cell, according to a location of the selected memory cell when an erase verify operation is performed, and to adjust a voltage level of the pipe transistor operation voltage PCG, which is applied to a selected memory cell, according to a location of the selected memory cell when a read operation is performed. When an erase verify operation is performed, the control logic 140 may control the voltage generation part 150 to classify the plurality of memory cells into a plurality of memory cell groups and generate different verify voltages Vverify for each memory cell group. The control logic 140 may control the voltage generation part 150 to classify the plurality of memory cells into a plurality of memory cell groups and apply a pipe transistor operation voltage PCG, which corresponds to the memory cell group having the selected memory cell among different pipe transistor operation voltages PCG corresponding to the respective memory cell groups, to the pipe transistor. The control logic 140 controls the voltage generation part 150 to adjust the voltage level of the verify voltage Vverify and the voltage level of the pipe transistor operation voltage PCG according to the number of program/erase cycles and the number of read operations. The control logic 140 may include counters for counting the number of program/erase cycles and the number of read operations.

The control logic 140 may control the voltage generation part 150 to generate the verify voltage Vverify, the read voltage Vread, the pass voltage Vpass, the pipe transistor operation voltage PCG, and the plurality of operation voltages.

Figure 2:
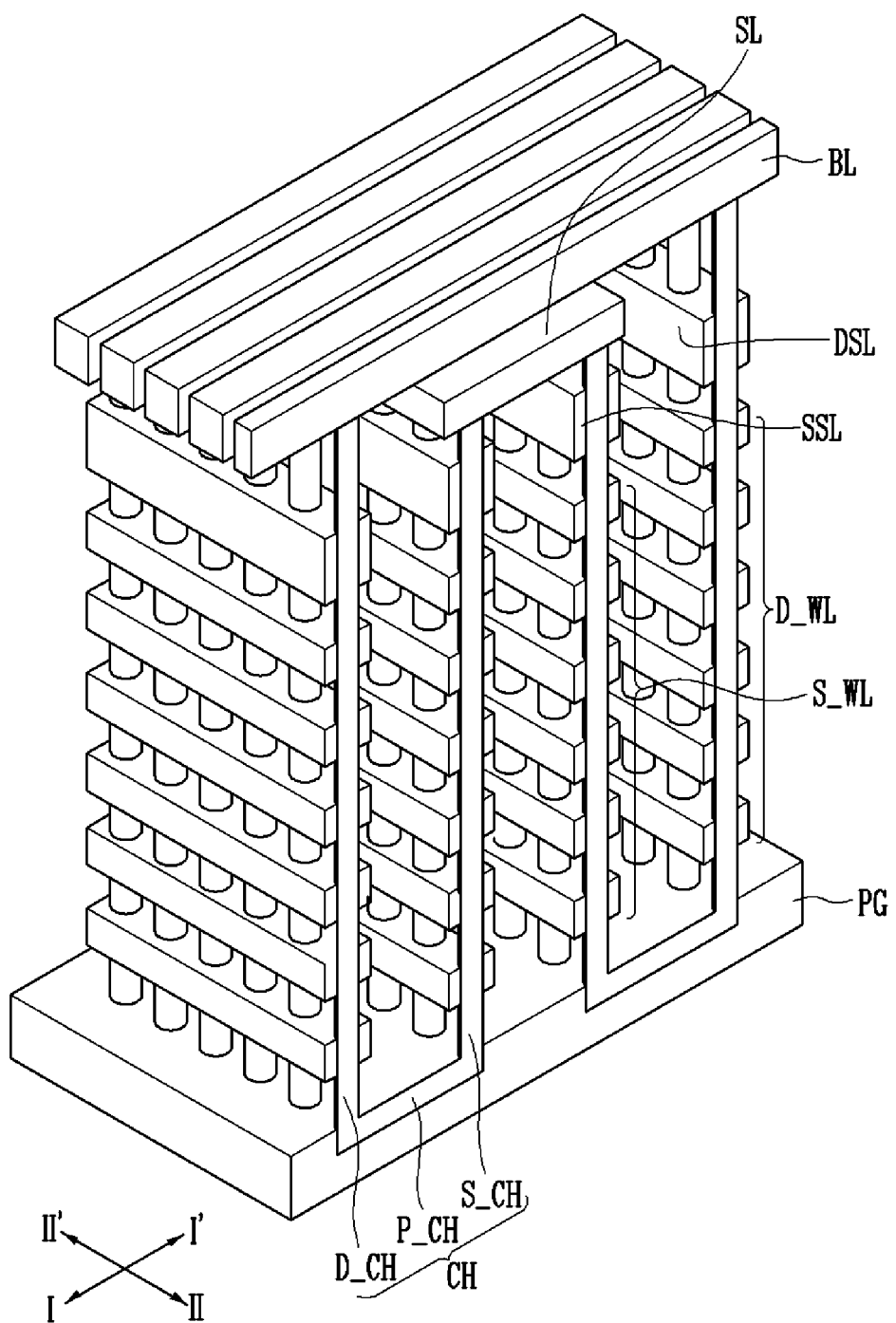
FIG. 2 is a perspective view illustrating a representation of a memory cell array of a semiconductor memory device according to an embodiment.

FIG. 2 is a perspective view illustrating a representation of a memory cell array of a semiconductor memory device according to an embodiment. However, interlayer insulating layers are omitted for convenience of description.

Referring to FIG. 2, the memory cell array includes U-shaped channel layers CH arranged in a first direction I-I' and a second direction II-II' crossing the first direction I-I'. Here, the U-shaped channel layer CH includes a pipe channel layer P_CH formed in a pipe gate PG, and a pair including a source side channel layer S_CH and a drain side channel layer D_CH coupled to the pipe channel layer P_CH.

The semiconductor memory device includes source side word line layers S_WL stacked along the source side channel layer S_CH on the pipe gate PG. The semiconductor memory device includes drain side word line layers D_WL stacked along the drain side channel layer D_CH on the pipe gate PG. Here, a source select line layer SSL is stacked on the source side word line layers S_WL. Also, a drain select line layer DSL is stacked on the drain side word line layers D_WL. In these cases, dummy word line layers (not shown) may be stacked between the drain side word line layers D_WL and the drain select line layer DSL. Also, dummy word line layers (not shown) may be stacked between the source side word line layers S_WL and the source select line layer SSL.

According to the semiconductor memory devices having the above-described structure, the memory cells are stacked along the U-shaped channel layer CH, a drain select transistor and a source select transistor are provided at both ends of the U-shaped channel layer CH, respectively, and the pipe gate PG, disposed at the bottom of the strings in a U shape, is disposed in the intermediate position of the memory cells and operates as a pipe transistor.

Further, the semiconductor memory device has bit line layers BL coupled to the drain side channel layer D_CH and extending in the first direction I-I', and a source line layer SL coupled to the source side channel layer S_CH and extending in the second direction II-II'.

Figure 3:
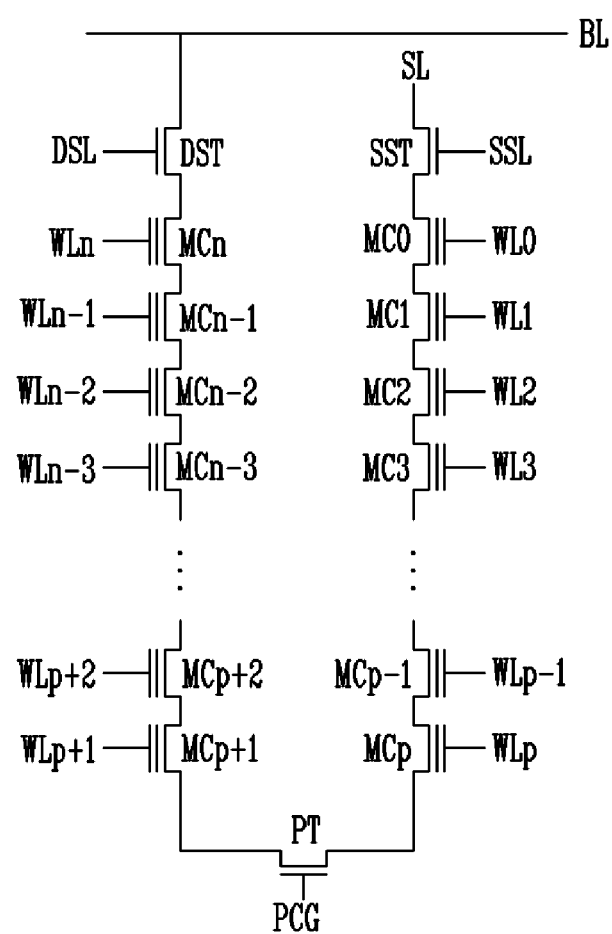
FIG. 3 is a circuit diagram illustrating a representation of a string of a semiconductor memory device according to an embodiment.

FIG. 3 is a circuit diagram illustrating a representation of a string of a semiconductor memory device according to an embodiment.

Referring to FIG. 3, the string may include a drain select transistor DST, a plurality of memory cells MC0 to MCn (where n is a natural number greater than zero), a pipe transistor PT, and a source select transistor SST, which are coupled in series between a bit line BL and a source line SL. The plurality of memory cells MCp+1 to MCn (where p is a natural number greater than or equal to zero), which are disposed between the drain select transistor DST and the pipe transistor PT among the plurality of memory cells MC0 to MCn, may be defined as drain side memory cells, and the plurality of memory cells MC0 to MCp, which are disposed between the source select transistor SST and the pipe transistor PT among the plurality of memory cells MC0 to MCn, may be defined as source side memory cells.

A gate of the drain select transistor DST is coupled to a drain select line DSL. A gate of the source select transistor SST is coupled to a source select line SSL. Gates of the plurality of memory cells MC0 to MCn are coupled to a plurality of word lines WL0 to WLn (where n is a natural number greater than zero), respectively. A gate of the pipe transistor PT is coupled to a pipe transistor gate line so that the pipe transistor operation voltage PCG generated from the voltage generation part 150, illustrated in FIG. 1, may be applied thereto.

Figure 4:
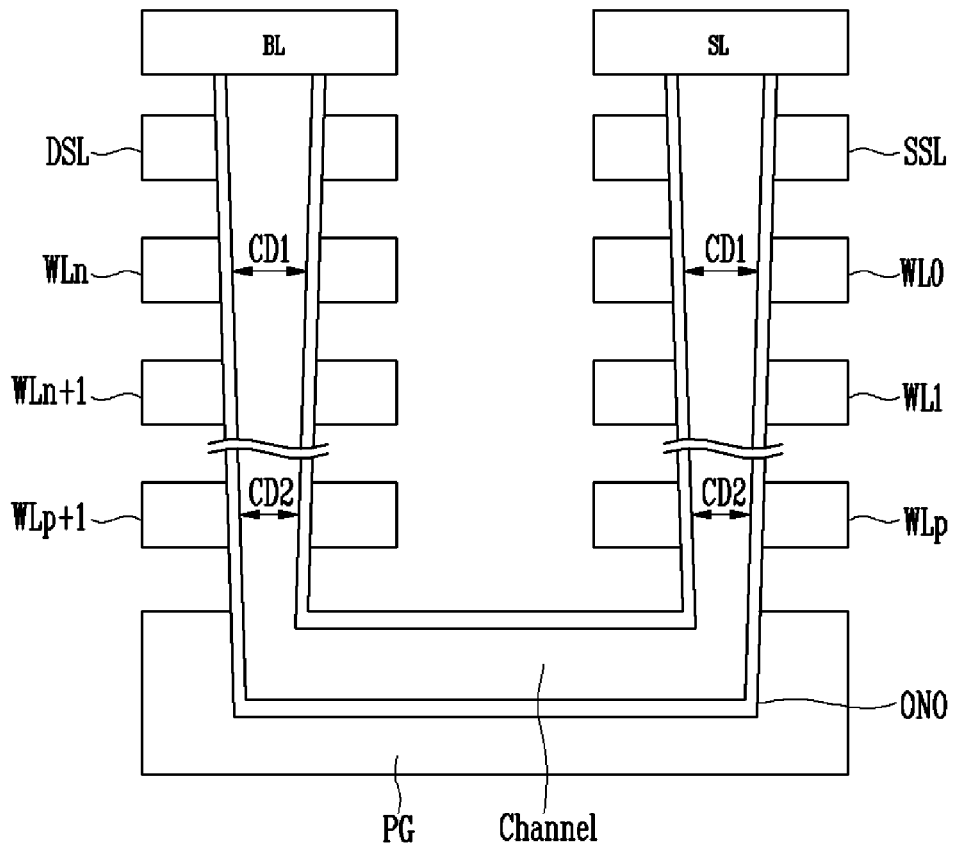
FIG. 4 is a cross-sectional view of a representation of a device for illustrating a string having a U-shaped channel layer.

FIG. 4 is a cross-sectional view of a representation of a device for illustrating a string having a U-shaped channel layer.

Referring to FIG. 4, one end of a U-shaped channel layer Channel is coupled to a bit line BL and the other end of the U-shaped channel layer Channel is coupled to a source line SL. A part of the U-shaped channel layer Channel formed in a pipe gate PG operates as a pipe transistor.

The string includes a plurality of word line layers WL0 to WLp, and WLp+1 to WLn stacked along the U-shaped channel layer Channel on the pipe gate PG. A drain select line DSL is formed at an end part of the U-shaped channel layer Channel coupled to the bit line BL, and a source select line SSL is formed at an end part of the U-shaped channel layer Channel coupled to the source line SL. A surface of the U-shaped channel layer Channel may be formed to have a structure on which a memory layer ONO covers.

The above-described U-shaped channel layer Channel is formed by alternately stacking a plurality of material layers, forming a U-shaped plug hole by etching the plurality of material layers, and filling the U-shaped plug hole with a channel material in a manufacturing process. When forming the U-shaped plug hole, a critical dimension CD1 (i.e., first critical dimension) of an opening part of an upper hole is greater than a critical dimension CD2 (i.e., second critical dimension) of an opening part of a lower hole. Thus, memory cells adjacent to the pipe gate PG, and memory cells adjacent to the source select line SSL and the drain select line DSL have different threshold voltage characteristics. For example, when an erase operation is performed, the memory cells adjacent to the pipe gate PG have fast cell characteristics, in which threshold voltages are quickly changed. Also, for example, the memory cells adjacent to the source select line SSL and the drain select line DSL have slow cell characteristics in which threshold voltages are relatively slowly changed. This difference in characteristics may increase as the number of program/erase operations (E/W cycle), and the number of read operations gradually increase.

Figure 5:
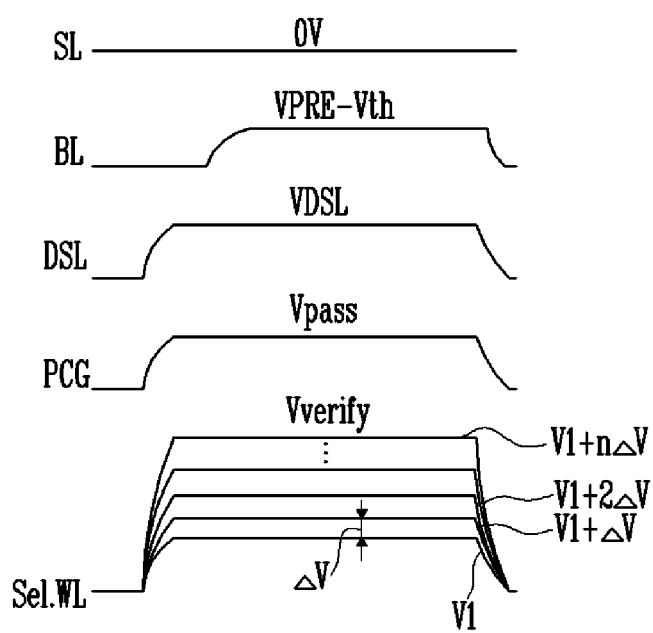
FIG. 5 is a waveform diagram of signals for illustrating a representation of an erase verify operation of a semiconductor memory device according to an embodiment.

FIG. 5 is a waveform diagram of signals for illustrating a representation of an erase verify operation of a semiconductor memory device according to an embodiment.

The erase verify operation according to an embodiment will be described with reference to FIGS. 1 to 5.

The control logic 140 generates the plurality of operation voltages including the verify voltage Vverify, the pass voltage Vpass, and the pipe transistor operation voltage PCG by controlling the voltage generation part 150 when an erase verify operation is performed.

When an erase verify operation is performed, a ground voltage 0V is applied to the source line SL of the memory cell array 110.

The verify voltage Vverify, the pass voltage Vpass, and the pipe transistor operation voltage PCG, which are generated from the voltage generation part 150, are applied to the memory cell array 110 by the address decoder 120. For example, the verify voltage Vverify is applied to a selected word line Sel.WL from a plurality of word lines WL, and the pass voltage Vpass is applied to non-selected word lines. Further, the pipe transistor operation voltage PCG applied to the pipe transistor PT may be the same voltage as the pass voltage Vpass. Therefore, other memory cells except the selected memory cell, and the pipe transistor PT turn on, and the selected memory cell, to which the verify voltage Vverify is applied, turns on or off according to a threshold voltage value, so that the verify operation is performed.

The control logic 140 controls the voltage generation part 150 to adjust a voltage level of the verify voltage Vverify generated from the voltage generation part 150 according to a location of the selected memory cell. For example, when the selected memory cell is a memory cell (e.g., MCp or MCp+1) adjacent to the pipe transistor PT, the voltage generation part 150 generates the verify voltage Vverify as a first voltage V1 and generates second voltages V1+ΔV to V1+nΔV by increasing the verify voltage Vverify by ΔV as the selected memory cell is disposed further away from the pipe transistor PT. In other words, the control logic 140 controls the voltage generation part 150 so that a voltage level of the verify voltage Vverify applied to the memory cells adjacent to the drain select transistor DST or the source select transistor SST may be higher than that of the verify voltage Vverify applied to the memory cells adjacent to the pipe transistor PT.

The bit lines BL are precharged with a precharge voltage VPRE-Vth by the read/write circuit 130.

Subsequently, the read/write circuit 130 senses a voltage level change of the precharged bit lines BL, so that an erase verify operation of the memory cells is performed.

As described above, according to the erase verify operation of the present invention, the verify voltage Vverify is increased by ΔV and applied as the selected memory cells is disposed further away from the pipe transistor PT. In a semiconductor memory device having a 3-dimensional structure, the erase verify operation is performed by adjusting the erase verify voltage Vverify in order to prevent a read/program disturb phenomenon resulting from a difference in variations of the threshold voltages according to locations of the memory cells having a gate-all-around (GAA) structure. As a result, the erase verify operation may be performed to generate uniform threshold voltages by compensating the difference in variations of the threshold voltages.

In order to reduce pass disturb on the memory cells adjacent to the drain select transistor DST, the verify voltage Vverify applied to the memory cells adjacent to the drain select transistor DST may be applied at a higher level than that of the memory cells adjacent to the source select transistor SST.

The above-described degradation characteristic of the memory cells may increase as the number of program/erase cycles and read operations increase. Thus, the control logic 140 may adjust and apply a value ΔV as the number of program/erase cycle and read increase.

Although the embodiment in which the verify voltage Vverify having different voltage levels are applied to different memory cells, a plurality of drain side memory cells MCp+1 to MCn, and a plurality of source side memory cells MC 0 to MCp may be classified into a plurality of memory cell groups, and the verify voltage Vverify having different voltage levels may be applied to the plurality of memory cell groups, so that the erase verify operation may be performed.

Figure 6:
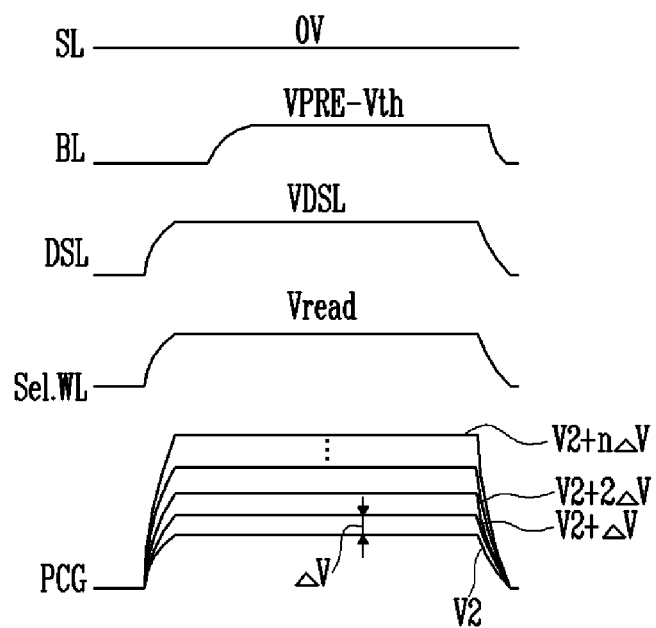
FIG. 6 is a waveform diagram of signals for illustrating a representation of a read operation of a semiconductor memory device according to an embodiment.

FIG. 6 is a waveform diagram of signals for illustrating a representation of a read operation of a semiconductor memory device according to an embodiment.

Referring to FIGS. 1 to 4, and 6, a read operation according to an embodiment will be described.

The control logic 140 generates the plurality of operation voltages including the read voltage Vread, the pass voltage Vpass, the pipe transistor operation voltage PCG by controlling the voltage generation part 150 when a read operation is performed.

When the read operation is performed, the ground voltage 0V is applied to the source line SL of the memory cell array 110.

The read voltage Vread, the pass voltage Vpass, and the pipe transistor operation voltage PCG, which are generated from the voltage generation part 150, are applied to the memory cell array 110 by the address decoder 120. For example, the read voltage Vread is applied to a selected word line Sel.WL from a plurality of word lines WL, and the pass voltage Vpass is applied to non-selected word lines. Therefore, the other memory cells except the selected memory cell turn on, and the selected memory cell, to which the read voltage Vread is applied, turns on or off depending on a threshold voltage value, so that the read operation is performed.

In these cases, the control logic 140 controls the voltage generation part 150 to adjust a voltage level of the pipe transistor operation voltage PCG generated from the voltage generation part 150 according to a location of the selected memory cell. For example, when the selected memory cell is a memory cell (e.g., MC0 or MCn) disposed away from the pipe transistor PT and adjacent to the drain or source select transistors DST or SST, the voltage generation part 150 generates the pipe transistor operation voltage PCG as a first voltage V2, and generates second voltages V2+ΔV to V2+nΔV by increasing the pipe transistor operation voltage PCG by ΔV as the selected memory cell is closer to the pipe transistor PT. The control logic 140 controls the voltage generation part 150 so that the pipe transistor operation voltage PCG may be increased, as the selected memory cell is closer to the pipe transistor PT.

When the selected memory cell is a memory cell disposed away from the pipe transistor PT and adjacent to the source select transistor SST, the voltage generation part 150 generates the pipe transistor operation voltage PCG as a first voltage. When the selected memory cell is adjacent to the pipe transistor PT, the voltage generation part 150 generates the pipe transistor operation voltage PCG as a second voltage. When the selected memory cell is a memory cell disposed away from the pipe transistor PT and adjacent to the drain select transistor SST, the voltage generation part 150 generates the pipe transistor operation voltage PCG as a third voltage. The third voltage may be greater than the first voltage.

The bit lines BL are precharged with a precharge voltage VPRE-Vth by the read/write circuit 130.

Subsequently, the read/write circuit 130 senses the voltage level change of the precharged bit lines BL, so that a read operation of the memory cells is performed.

As described above, according to the read operation of an embodiment, the pipe transistor operation voltage PCG is increased by ΔV and applied as the selected memory cells is closer to the pipe transistor PT. In such a semiconductor memory device of a 3-dimensional structure, the read disturb phenomenon in which a field varies according to locations of the memory cells having a gate-all-around (GAA) structure may be improved by adjusting the pipe transistor operation voltage PCG.

Further, in order to reduce pass disturbance on the memory cells adjacent to the drain select transistor DST, it may be controlled so that a voltage level of the pipe transistor operation voltage PCG applied when the selected memory cell is adjacent to the drain select transistor DST is higher than that of the pipe transistor operation voltage PCG applied when the selected memory cell is adjacent to the source select transistor SST.

The above-described degradation characteristics of the memory cells may increase as the number of program/erase cycles and read operations increase. Thus, the control logic 140 may adjust and apply the value ΔV as the number of program/erase cycles and read operations increase.

Although the embodiments in which the pipe transistor operation voltage PCG having different voltage levels is applied to each selected memory cell, a plurality of drain side memory cells MCp+1 to MCn, and a plurality of source side memory cells MC 0 to MCp may be classified into a plurality of memory cell groups, and the pipe transistor operation voltage PCG, which corresponds to the memory cell group having the selected memory cell among the different pipe transistor operation voltages PCG corresponding to the plurality of memory cell groups, may be applied to the pipe transistor.

Figure 7:
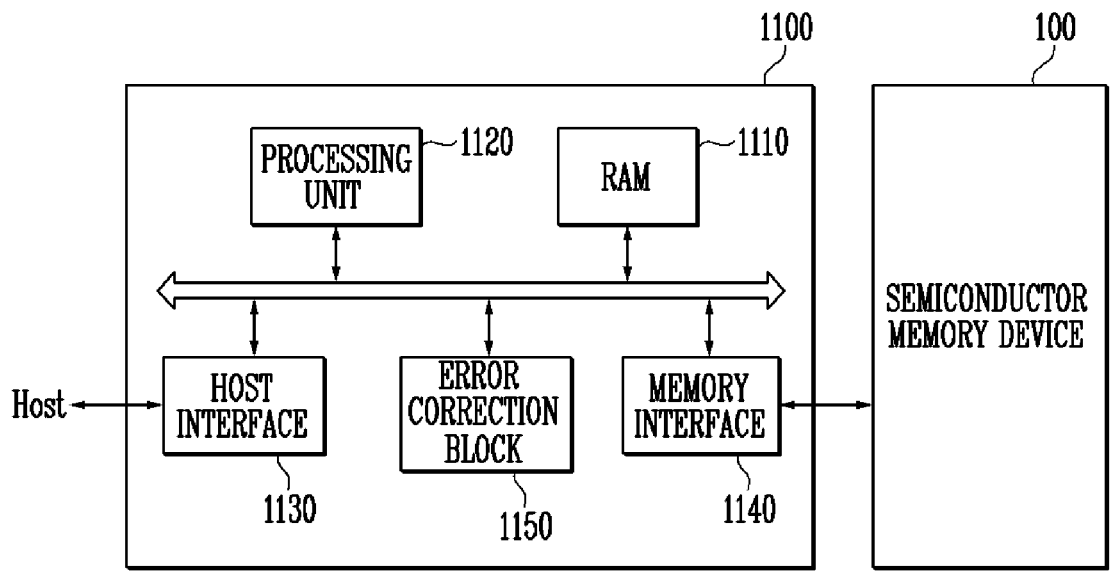
FIG. 7 is a block diagram illustrating a representation of a memory system including the semiconductor memory device illustrated in FIG. 1.

FIG. 7 is a block diagram illustrating a representation of a memory system including the semiconductor memory device illustrated in FIG. 1.

Referring to FIG. 7, a memory system 1000 may include a semiconductor memory device 100 and a controller 1100.

The semiconductor memory device 100 may be configured and operate in the same manner as described with reference to FIG. 1. Hereinafter, the duplicated description thereof will not be omitted.

The controller 1100 is coupled to a host Host and the semiconductor memory device 100. The controller 1100 accesses the semiconductor memory device 100 in response to a request from the host Host. For example, the controller 1100 controls read, write, erase, and background operations of the semiconductor memory device 100. The controller 1100 provides an interface between the semiconductor memory device 100 and the host Host. The controller 1100 drives firmware to control the semiconductor memory device 100.

The controller 1100 may include a random access memory (RAM) 1110, a processing unit 1120, a host interface 1130, a memory interface 1140, and an error correction block 1150. The RAM 1110 is used as at least one of an operational memory of the processing unit 1120, a cache memory between the semiconductor memory device 100 and the host Host, and a buffer memory between the semiconductor memory device 100 and the host Host. The processing unit 1120 controls overall operations of the controller 1100. Further, the controller 1100 may temporarily store program data provided from the host Host when a write operation is performed.

The host interface 1130 may include a protocol to exchange data between the host Host and the controller 1100. According to an embodiment, the controller 1100 communicates with the host Host through at least one of various interface protocols such as a Universal Serial Bus (USB) protocol, a multimedia card (MMC) protocol, a peripheral component interconnect (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, a private protocol, and the like.

The memory interface 1140 interfaces with the semiconductor memory device 100. For example, the memory interface 1140 includes a NAND interface or a NOR interface.

The error correction block 1150 detects and corrects an error of data received from the semiconductor memory device 100 using an error correcting code (ECC). The processing unit 1120 may adjust a read voltage according to an error detection result of the error correction block 1150 and control the semiconductor memory device 100 to perform a re-read operation. According to an embodiment, the error correction block 1150 may be provided as a component of the controller 1100.

The controller 1100 and the semiconductor memory device 100 may be integrated into one semiconductor device. According to an embodiment, the controller 1100 and the semiconductor memory device 100 may be integrated into one semiconductor device and form a memory card. For example, the controller 1100 and the semiconductor memory device 100 are integrated into one semiconductor device and may configure a memory card such as a personal computer (PC) card (personal computer memory card international association (PCMCIA)), a compact flash (CF) card, a smart-media card (SM or SMC), a memory stick, an MMC (reduced size MMC (RS-MMC), MMCmicro), a secure digital (SD) card (miniSD, microSD, SD high capacity (SDHC)), a universal flash storage (UFS), and the like.

The controller 1100 and the semiconductor memory device 100 are integrated into one semiconductor device and may configure a solid-state drive (SSD). The SSD includes a storage device configured to store data in a semiconductor memory. When the memory system 1000 is used as the SSD, an operation speed of the host Host coupled to the memory system 1000 is innovatively enhanced.

In an embodiment, the memory system 1000 is provided as at least one of various components of an electronic device such as a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices included in a home network, at least one of various electronic devices included in a computer network, at least one of various electronic devices included in a telematics network, an RFID device, at least one of various components included in a computing system, and the like.

According to an embodiment, the semiconductor memory device 100 or the memory system 1000 may be mounted using various packages types. For example, the semiconductor memory device 100 or the memory system 1000 may be packaged in such a manner such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), and so on, and may be mounted.

Figure 8:
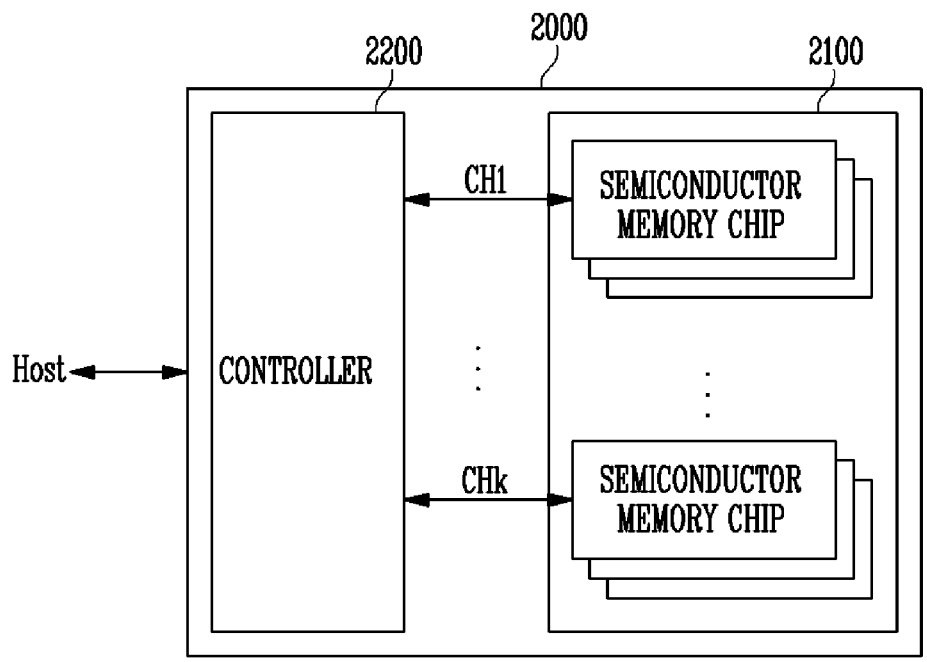
FIG. 8 is a block diagram illustrating a representation of an application example of the memory system illustrated in FIG. 7.

FIG. 8 is a block diagram illustrating a representation of an application example of the memory system shown in FIG. 7.

Referring to FIG. 8, a memory system 2000 may include a semiconductor memory device 2100 and a controller 2200. The semiconductor memory device 2100 includes a plurality of semiconductor memory chips. The plurality of semiconductor memory chips are divided into a plurality of groups.

In FIG. 8, the plurality of groups are shown to communicate with the controller 2200 through first to kth channels CH1 to CHk, respectively. Each semiconductor memory chip is configured and operates as one component of the semiconductor memory device 100 described with reference to FIG. 1.

Each group communicates with the controller 2200 through one common channel. The controller 2200 is configured as the controller 1100 described with reference to FIG. 7, and controls the plurality of memory chips of the semiconductor memory device 2100 through the plurality of channels CH1 to CHk.

Figure 9:
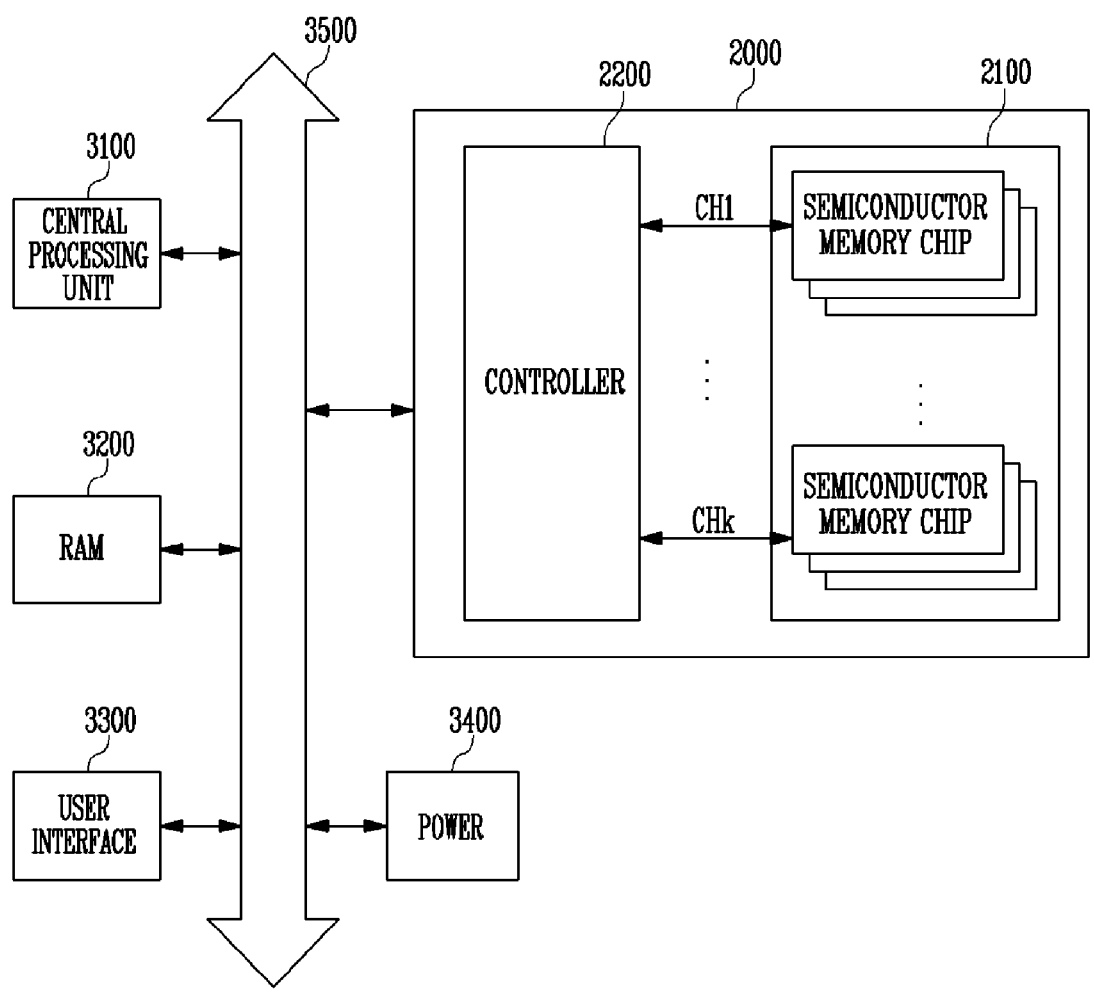
FIG. 9 is a block diagram illustrating a representation of a computing system including the memory system described with reference to FIG. 8.

FIG. 9 is a block diagram illustrating a representation of a computing system including the memory system described with reference to FIG. 8.

Referring to FIG. 9, a computing system 3000 may include a central processing unit 3100, a random access memory (RAM) 3200, a user interface 3300, a power 3400, a system bus 3500, and the memory system 2000.

The memory system 2000 is electrically coupled to the central processing unit 3100, the RAM 3200, the user interface 3300, and the power 3400 through the system bus 3500. Data, which is provided through the user interface 3300 or processed by the central processing unit 3100, is stored in the memory system 2000.

In FIG. 9, the semiconductor memory device 2100 is illustrated as being coupled to the system bus 3500 through the controller 2200. However, the semiconductor memory device 2100 may be directly coupled to the system bus 3500. Functions of the controller 2200 may be performed by the central processing unit 3100 and the RAM 3200.

In FIG. 9, the memory system 2000 described with reference to FIG. 8 is provided. However, the memory system 2000 may be replaced by the memory system 1000 described with reference to FIG. 7. According to an embodiment, the computing system 3000 may include all of the memory systems 1000 and 2000 described with reference to FIGS. 7 and 8.

According to an embodiment, read disturb and program disturb of memory cells may be improved by applying different verify voltages to different word lines when an erase verify operation of the semiconductor memory device is performed, and the read disturb of the memory cells can be reduced by applying different operation voltages applied to a pipe transistor included in a cell string, in response to the selected word line when a read operation of the semiconductor memory device is performed.

In the drawings and specification, there have been disclosed various embodiments, and although specific terms are employed, they are used in a generic and descriptive sense only and not for purposes of limitation.

What is claimed is:

1. A semiconductor memory device, comprising:
    a memory cell array having a plurality of strings each including a drain select transistor, a plurality of drain side memory cells, a pipe transistor, a plurality of source side memory cells, and a source select transistor;
    a peripheral circuit configured to provide a plurality of operation voltages including an erase verify voltage to the plurality of strings; and
    a control logic configured to control the peripheral circuit to adjust a voltage level of the erase verify voltage applied to a selected memory cell, from among the plurality of drain side memory cells and the plurality of source side memory cells, according to a distance between the selected memory cell and the pipe transistor when an erase verify operation is performed.

2. The semiconductor memory device of claim 1, wherein the erase verify voltage is reduced as the selected memory cell is closer to the pipe transistor.

3. The semiconductor memory device of claim 1, wherein the string has a U-shaped channel layer structure.

4. The semiconductor memory device of claim 3, wherein the U-shaped channel layer structure has a first critical dimension greater than a second critical dimension.

5. The semiconductor memory device of claim 1, wherein the peripheral circuit classifies the plurality of drain side memory cells and the plurality of source side memory cells into a plurality of memory cell groups, and generates and applies different erase verify voltages to the plurality of memory cell groups.

6. The semiconductor memory device of claim 1, wherein the peripheral circuit applies the erase verify voltage to the selected memory cell, a pass voltage to other memory cells except the selected memory cell, and a pipe transistor operation voltage to the pipe transistor.

7. The semiconductor memory device of claim 6, wherein the pipe transistor operation voltage has a same voltage level as the pass voltage.

8. The semiconductor memory device of claim 1, wherein the peripheral circuit comprises:
    a voltage generation part suitable for generating a plurality of operation voltages including the erase verify voltage in response to control of the control logic;
    an address decoder suitable for providing the plurality of operation voltages including the erase verify voltage to the memory cell array; and
    a read/write circuit coupled to bit lines of the memory cell array, wherein the read/write circuit is suitable for precharging the bit lines or sensing voltage levels of the bit lines.

9. The semiconductor memory device of claim 1, wherein the control logic controls the peripheral circuit to adjust the erase verify voltage as the number of program/erase cycles and read operations increase.

10. The semiconductor memory device of claim 9, wherein the control logic controls the peripheral circuit to increase the erase verify voltage as the number of program/erase cycles and read operations increase.

11. The semiconductor memory device of claim 1, wherein the control logic controls the peripheral circuit to gradually increase the erase verify voltage as the selected memory cell is closer to the drain select transistor when the selected memory cell is disposed between the drain select transistor and the pipe transistor, and to gradually increase the erase verify voltage as the selected memory cell is closer to the source select transistor when the selected memory cell is disposed between the source select transistor and the pipe transistor.

12. The semiconductor memory device of claim 1, wherein the control logic is further configured to control the peripheral circuit to adjust the voltage level of the erase verify voltage applied at a gate of the selected memory cell.

13. A semiconductor memory device, comprising:
    a memory cell array having a plurality of strings each including a drain select transistor, a plurality of drain side memory cells, a pipe transistor, a plurality of source side memory cells, and a source select transistor;
    a peripheral circuit configured to provide a plurality of operation voltages including read voltage to the string; and a control logic configured to control the peripheral circuit to adjust a voltage level of a pipe transistor operation voltage applied to the pipe transistor according to a distance between the pipe transistor and a selected memory cell, from among the plurality of drain side memory cells and the plurality of source side memory cells, when a read operation is performed.

14. The semiconductor memory device of claim 13, wherein the control logic increases the pipe transistor operation voltage as the selected memory cell is closer to the pipe transistor.

15. The semiconductor memory device of claim 13, wherein the control logic controls the peripheral circuit to gradually increase the pipe transistor operation voltage as the number of program/erase cycles and read operations gradually increase.

16. The semiconductor memory device of claim 13, wherein the control logic controls the peripheral circuit to gradually increase the pipe transistor operation voltage as the selected memory cell is closer to the drain select transistor.

17. The semiconductor memory device of claim 13, wherein the string has a U-shaped channel layer structure.

18. The semiconductor memory device of claim 13, wherein the peripheral circuit applies the read voltage to the selected memory cell, and a pass voltage to other memory cells except the selected memory cell.

19. The semiconductor memory device of claim 13, wherein the peripheral circuit classifies the plurality of drain side memory cells and the plurality of source side memory cells into a plurality of memory cell groups, and applies the pipe transistor operation voltage, which corresponds to the memory cell group having the selected memory cell, among different pipe transistor operation voltages corresponding to the plurality of memory cell groups, to the pipe transistor.

20. The semiconductor memory device of claim 13, wherein the memory cell string has a U-shaped channel layer structure and includes source side memory cells, the pipe transistor, and drain side memory cells connected in series between a source select transistor and a drain select transistor.

21. The semiconductor memory device of claim 13, wherein the control logic is further configured to control the peripheral circuit to adjust the voltage level of the pipe transistor operation voltage applied at a gate of the selected memory cell.

22. An operating method of a semiconductor memory device, the operating method comprising:
    applying a read voltage to a selected memory cell, from among a plurality of memory cells of a memory cell string, and a pass voltage to non-selected memory cells when a read operation is performed;
    applying a first voltage to a pipe transistor of the memory cell string when the selected memory cell is adjacent to a source select transistor; and
    applying a second voltage to the pipe transistor when the selected memory cell is adjacent to the pipe transistor.

23. The operating method of claim 22, wherein the first voltage is higher than the second voltage.

24. The operating method of claim 22, further comprising:
    applying a third voltage to the pipe transistor when the selected memory cell is adjacent to a drain select transistor, and
    wherein the third voltage is greater than the first voltage.

25. The operating method of claim 22, wherein applying the first voltage to the pipe transistor comprises applying the first voltage to a gate of the pipe transistor and wherein applying the second voltage to the pipe transistor comprises applying the second voltage to the gate of the pipe transistor.

* * * * *